United States Patent [19]
Ferrant

[11] Patent Number: 5,982,679
[45] Date of Patent: Nov. 9, 1999

[54] MEMORY CIRCUIT WITH DYNAMIC REDUNDANCY

[75] Inventor: Richard Ferrant, Saint Ismier, France

[73] Assignee: SGS-Thomson Microelectronics S.A., Saint Genis, France

[21] Appl. No.: 09/086,625

[22] Filed: May 29, 1998

[30] Foreign Application Priority Data

May 30, 1997 [FR] France ................................. 97 06902

[51] Int. Cl.⁶ .................................................... G11C 7/00
[52] U.S. Cl. .......................... 365/200; 365/96; 365/225.7
[58] Field of Search .......................... 365/200, 96, 225.7

[56] References Cited

U.S. PATENT DOCUMENTS

| | | | |
|---|---|---|---|
| 4,780,851 | 10/1988 | Kurakami | 365/200 |
| 5,255,217 | 10/1993 | Tan | 365/96 |
| 5,255,227 | 10/1993 | Haeffele | 365/200 |
| 5,471,427 | 11/1995 | Murakami et al. | 365/200 |
| 5,498,990 | 3/1996 | Leung et al. | 327/323 |
| 5,574,729 | 11/1996 | Kinoshita et al. | 371/10.3 |
| 5,592,632 | 1/1997 | Leung et al. | 395/306 |
| 5,613,077 | 3/1997 | Leung et al. | 395/306 |
| 5,666,480 | 9/1997 | Leung et al. | 395/180 |

*Primary Examiner*—David Nelms
*Assistant Examiner*—Van Thu Nguyen
*Attorney, Agent, or Firm*—Wolf, Greenfield & Sacks, P.C.

[57] ABSTRACT

The present invention relates to an integrated circuit including at least one matrix network of identical elements capable of being individually addressed at least in a first direction and including, at least for this first direction, at least one redundancy element, and a circuit that reversibly inhibits the operation of a defective element and maintains the circuit operation by using the redundancy element.

6 Claims, 3 Drawing Sheets

MEMORY CIRCUIT WITH DYNAMIC REDUNDANCY

BACKGROUND OF THE INVENTION

1. Field of the Invention

The present invention relates to memories implemented in the form of a matrix network of memory cells in an integrated circuit. The present invention more specifically applies to memories provided with a redundancy element for functionally replacing a defective element of the memory (for example, a column or a row).

2. Discussion of the Related Art

The use of a redundancy element to replace a defective element must be performed transparently for the user. Memory circuits are thus generally associated with redundancy or repair circuits, meant to permanently modify the selection of the memory columns when one of these columns has failed a test. For this purpose, fuses operated during a test phase of the manufacturing process are generally used. Several architectures may be used to organize the routing of the decoded column addresses.

A first architecture provides a redundancy column next to a group of columns forming the matrix, and associates each column, that might be replaced, with a fuse to connect, in the place of a defective column, the redundancy column.

A second architecture uses a fuse matrix to store the address of the defective column and a comparator receiving the address of the column and the defective address stored by the fuse matrix. The comparator directs, upon each reading from or writing into the memory, the current datum to the redundancy column if the current address corresponds to the address stored by the fuse matrix.

More recently, redundancy circuits reducing the number of necessary fuses to implement replacement of a defective element of the memory have been provided. Such circuits consist of shifting, from one column and from column to column, the addressing of the memory towards the redundancy column, each column in the memory being capable of being used as a replacement column for the preceding column. The advantage of such circuits with respect to prior solutions is that they make the times of access to the memory cells uniform, even in case of a use of the redundancy column. Examples of redundancy circuits of this type are described in patents WO-A-9406082 and EP-A-0477809 which patents are incorporated herein by reference.

FIG. 1 shows a conventional example of a redundancy memory circuit of the type described in patent WO-A-9406082. This drawing shows a memory circuit including two groups or matrix networks 1, 1' of memory cells 2, 2' likely to each store one data bit. Each network 1, 1' includes m rows and n+1 columns, the n+1-th column forming a redundancy column for replacing a column containing a defective cell among the n first columns. Cells 2, 2' are addressed by means of an address bus 3 carrying, in the form of a binary address, the coordinates (column and row) of a memory word formed of several bits.

In the example shown, it is assumed that a memory word includes two bits and that each network 1, 1' is associated with one bit of a memory word. The binary address of a memory word is carried by bus 3 over k bits. This address is decoded by row and column decoders 4 and 5, for extracting from address A carried by bus 3 a row address Ar and a column address Ac, that is, the vertical and horizontal coordinates of the memory word in the memory. Generally, the column address is carried by least significant bits of address A, while the row address is carried by most significant bits. m outputs of decoder 4 form row conductors 6 enabling to select the row of the addressed memory word, a single one of the row conductors being active. Column decoder 5 is meant to activate a column conductor 7 of each group 1, 1' corresponding to the column address of the memory word.

Each matrix network 1, 1' is associated with a data input/output 8, 8' on which the memory word is input or read. Each terminal 8, 8' is associated with a read amplifier 9, 9' and with a write amplifier 10, 10'. Each network 1, 1' is further associated with a multiplexer 11, 11' for routing the data bit to a column conductor 7, 7' of network 1, 1'. The selection of conductor 7, 7' is performed based on column address Ac.

A redundancy circuit 12 is interposed between n outputs of decoder 5 and n+1 control inputs of multiplexers 11, 11'. Circuit 12 is formed by a fuse circuit 13 and a routing circuit 15. Circuits 13 and 15 are, in practice, overlapping and have the function of shifting the electric connection from an output conductor 14 of decoder 5 to a conductor 16 of next rank at the output of circuit 15 if the conductor 16 of same rank as conductor 14 is associated with a column 7 or 7' including a defective cell 2 or 2'. Thus, circuit 13 includes as many fuses as decoder 5 includes outputs 14 and circuit 15 includes as many output 16 as each of networks 1 and 1' include columns 7, 7'. If the connection of a conductor 14 is shifted to a conductor 16 of next rank, this shifting is repeated for all conductors 14 of higher rank so that the conductor 14 of highest rank is associated with the redundancy column.

A disadvantage of conventional redundancy architectures is that the shifting, as concerns the addressing, of a defective column to the next column to use the redundancy column is performed simultaneously for all networks 1, 1' as soon as one of these networks includes a defective cell. Thus, the circuit must include as many redundancy columns as there are matrix networks 1, 1' associated with a data bit even when only a single defective column in the entire memory can be corrected or repaired by the redundancy columns.

Another disadvantage of conventional circuits equipped with redundancy elements is that they use destructive fusible elements (for example, which can be fused by laser or electric current) or the state of which is modified irreversibly to modify, from the addressing viewpoint, the organization of the columns of the matrix networks. This leads, in practice, to implementing a redundancy element only during tests performed during the memory manufacturing. Indeed, it is generally not desirable to enable an end user to act in a definitive manner upon the internal structure of an integrated circuit. Now, the failure of the memory cell may occur during the operation of a system with which the memory is associated. In such a case, the memory circuit conventionally becomes unusable even when a redundancy element can remain available.

SUMMARY OF THE INVENTION

The present invention aims at overcoming the disadvantages of conventional redundancy memory circuits.

The present invention more generally relates to any integrated matrix structure of identical elements associated with at least one redundancy element to take over the operation of a defective element. These can be, for example, identical operators implemented in the form of a matrix network in an integrated circuit in one or two directions (for example, operators organized in systolic architecture), or even more complex elements (for example, processors) which are either used individually by an adapted selection addressing in a matrix network including several of these elements, or used in parallel by all receiving common information in a first direction and one or several individualized pieces of information in a second direction. Except for memories, the more the integrated element is complex, the more this element risks to have a temporary operation failure linked, for example, to a non-reproducible malfunction during a system initialization procedure.

According to a first aspect, the present invention aims at enabling a dynamic and reversible repair of a defect in a memory cell by using a redundancy element.

More generally, according to this first aspect, the present invention aims at enabling the use of a redundancy element in an integrated circuit including a matrix structure of identical elements by repairing, dynamically and reversibly, a failure of one of the elements by the use of the redundancy element.

The present invention also aims at combining a reversible repair with an irreversible repair.

According to a second aspect, the present invention aims at optimizing the use of redundancy lines (rows or columns) in a memory by inhibiting the operation of a line including a defective cell, which is different from one matrix network to the other in a circuit including several matrix networks all simultaneously addressed according to a first direction.

To achieve these and other objects, the present invention provides an integrated circuit including at least one matrix network of identical elements capable of being individually addressed at least in a first direction and including, at least for this first direction, at least one redundancy element, and means for reversibly inhibiting the operation of a defective element and for maintaining the circuit operation by using the redundancy element.

According to an embodiment of the present invention, the circuit further includes a means for definitively inhibiting the operation of a defective element.

According to an embodiment of the present invention, applied to a circuit including several matrix networks of identical elements to be simultaneously addressed in a second direction, this circuit includes, for each matrix network, a redundancy circuit for organizing the use of a redundancy element associated with this matrix network independently from the other matrix networks.

The present invention also relates to a memory provided with at least one matrix network of cells and at least one redundancy element associated with a first direction, and including at least one redundancy circuit for reversibly modifying the addressing in the first direction to use the redundancy element in the presence of a defective memory cell in the matrix network.

According to an embodiment of the present invention, applied to a memory including at least n+1 successive columns of cells, the redundancy circuit includes as many logic units as the matrix network includes columns, n first units including a selector for routing an address conductor associated with the corresponding column, either to the memory cells associated with this column, or to the memory cells associated with the next column.

According to an embodiment of the present invention, each of the n first units further includes a fuse for definitively inhibiting the operation of a defective column.

According to an embodiment of the present invention, the memory includes several matrix networks and, for each network, at least one redundancy element associated with a first direction and at least one redundancy circuit, each redundancy circuit being individually controllable.

The foregoing objects, features and advantages of the present invention will be discussed in detail in the following non-limiting description of specific embodiments in connection with the accompanying drawings.

DETAILED DESCRIPTION

Figure 1:
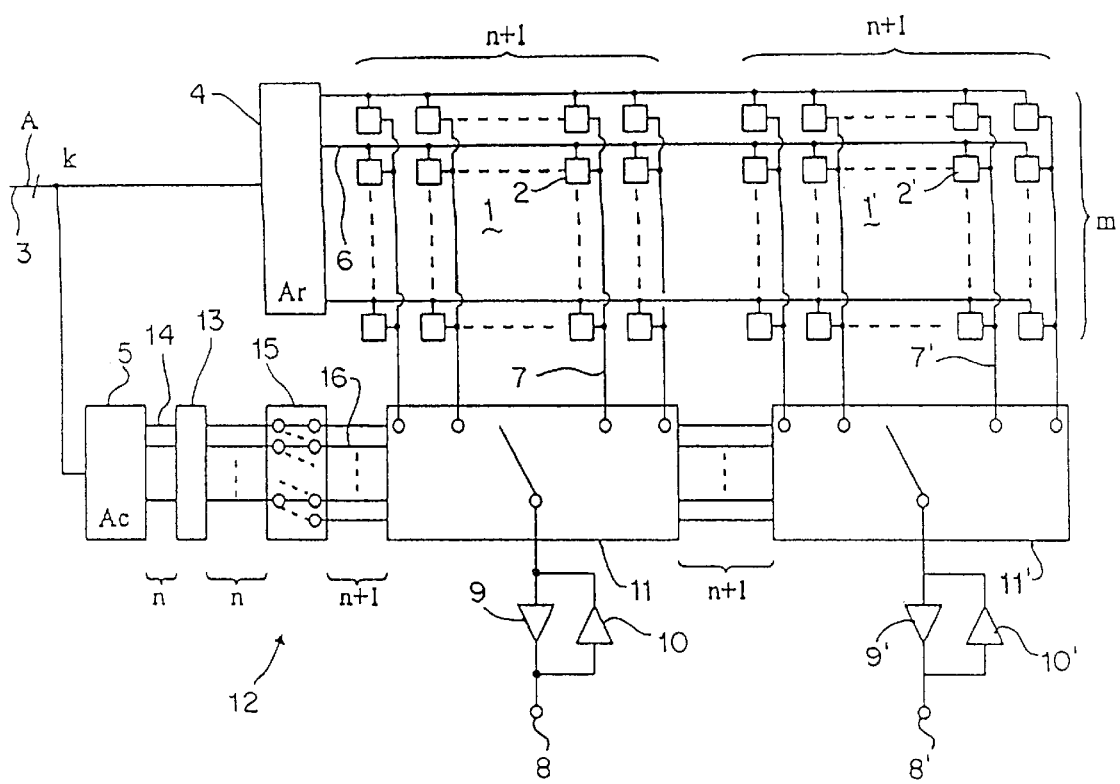
FIG. 1, previously described, is meant to show the state of the art and the problem to solve.

The same elements have been referred to with the same references in the different drawings. For clarity, only those elements which are necessary to the understanding of the present invention have been shown in the drawings and will be described hereafter.

Figure 2:
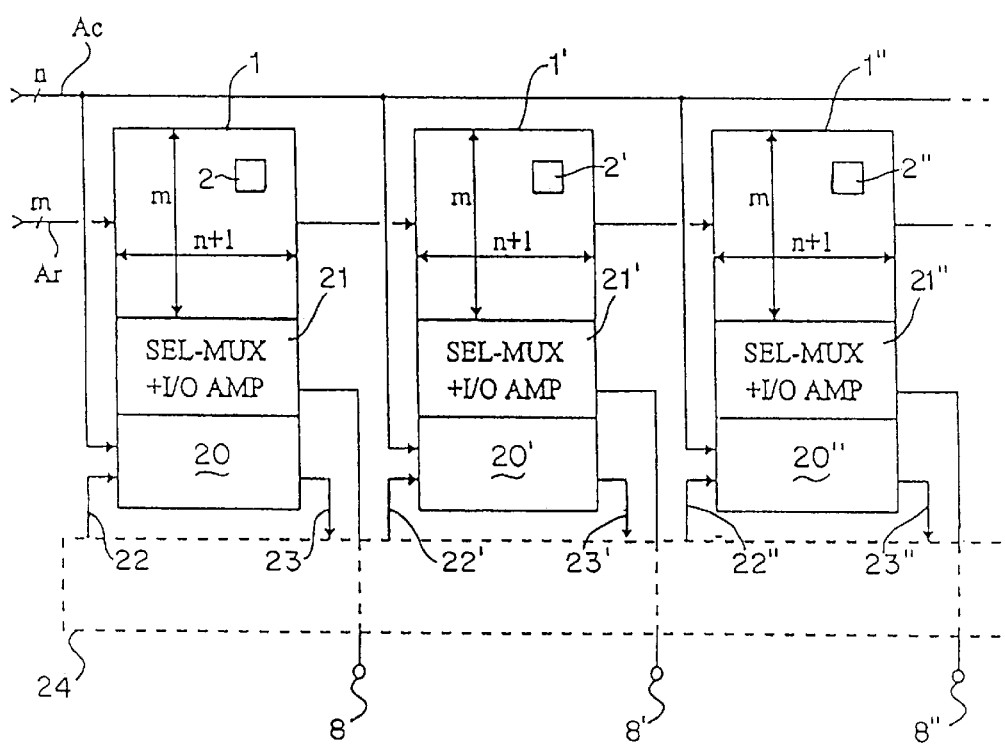
FIG. 2 shows a memory circuit architecture according to an embodiment of the present invention.

FIG. 2 shows an example of an architecture of a redundancy memory circuit according to an embodiment of the present invention. As previously, the memory circuit is, for example, organized in matrix networks or groups 1, 1', 1" of memory cells 2, 2', 2", each group 1, 1', 1" being associated with one of the bits of a memory word containing several bits. Each network includes, for example, m rows and n+1 columns, the column of rank n+1 forming, for each network 1, 1', 1", a redundancy column or element.

The present invention will be described hereafter in relation with a memory circuit provided with redundancy columns. It should however be noted that the present invention also applies to the case where the redundancy elements are formed by memory cell rows as well as to the case where redundancy elements are provided in both directions.

Row address Ar is, as previously, determined by a conductor in the active state among m row conductors and is the same for all matrix networks 1, 1', 1". Column address Ac corresponds to a conductor among n conductors in an active state. Addresses Ac and Ar correspond, for example, to the address conductors issued by decoders 4 and 5 of the circuit shown in FIG. 1.

According to the present invention, each network 1, 1', 1" of memory cells is associated with a redundancy circuit 20, 20', 20" and reorganizes, independently from the possible reorganization of the column addresses of the other networks, the addressing of the column conductors in the presence of a defective memory cell.

Each group 1, 1', 1" also includes a circuit 21, 21', 21" for routing (SEL_MUX) the datum input on a terminal 8, 8', 8" to the column conductor (not shown in FIG. 2) corresponding to the addressed memory cell among the n+1 columns of the group. In the embodiment shown in FIG. 2, circuits 21, 21', 21" also integrate input/output amplifiers (I/O AMP), one input/output amplifier being associated with each column conductor of group 1, 1', 1" as close as possible to the memory cells of this group. Indeed, recent memories are most often provided to operate with signal levels, especially in the read mode, which are very low, which leads to placing the input/output amplifiers as close as possible to the memory cells. Such an architecture appears in particular in the case of a DRAM.

Each redundancy circuit receives the n column addresses Ac and includes n+1 column conductor outputs, the n+1-th output being used in case of a failure of a cell of a column of lower rank. Preferably, the reorganization of the column addresses is performed, as in the conventional case shown in FIG. 1, by a successive shifting of the column conductors from the conductor of the defective cell. Each circuit 20, 20', 20" also includes an input 22, 22', 22" of reception of a shift control signal (repair) and an output 23, 23', 23" indicative of the use of the redundancy column.

The signals of repair and indication of the use of the redundancy column are issued and used by a circuit of control and detection of defective cells. This device can be formed of a conventional test system or can be formed of a test circuit 24 (shown in dotted lines in FIG. 2) for automatically detecting a defective cell and then controlling the shifting of the address of the column including this defective cell to the next column, and so on.

According to the present invention, the means used to organize the shifting of the column conductors to the next conductors are volatile means, that is, they are reset upon each powering-off of the memory circuit.

Figure 3:
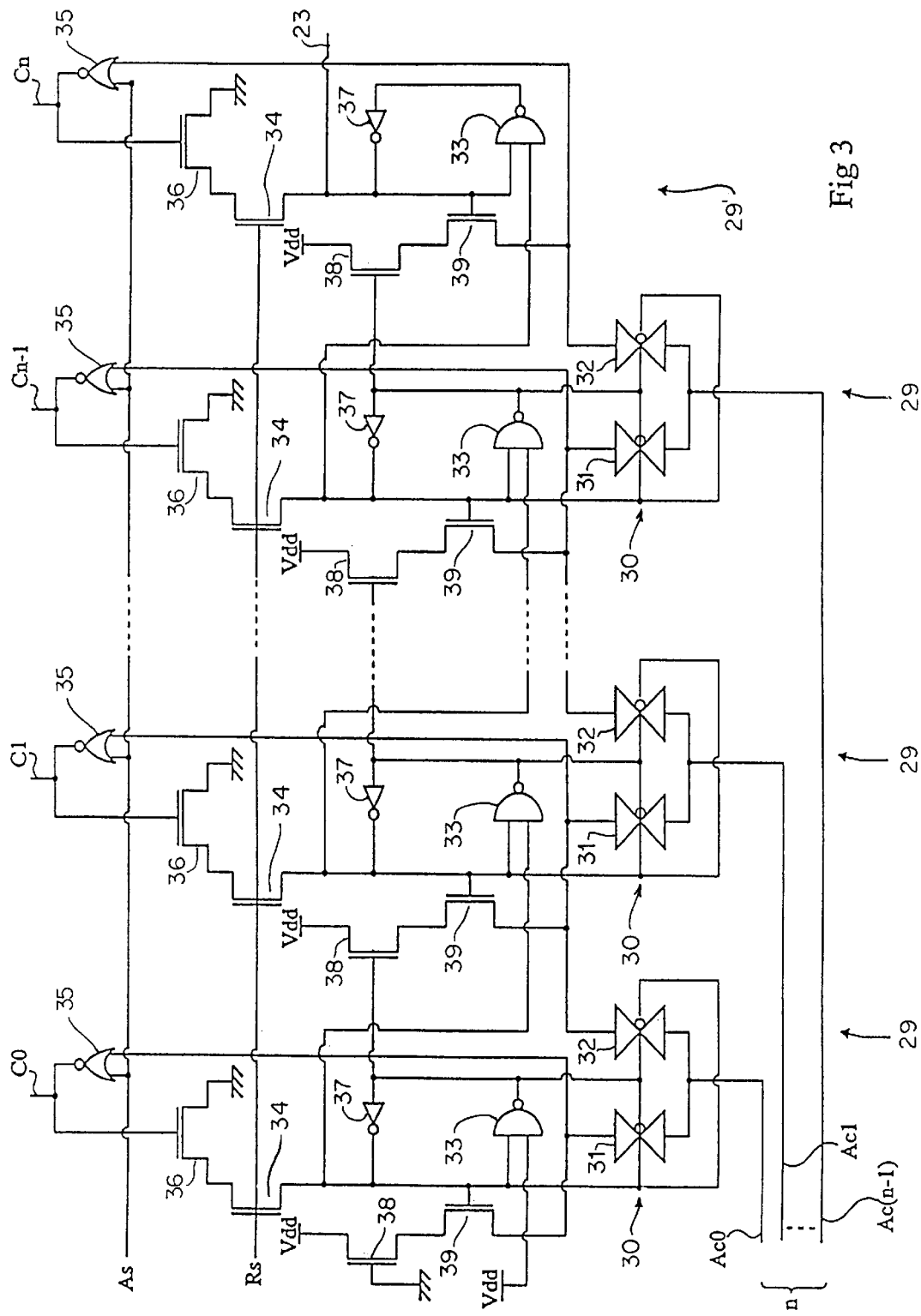
FIG. 3 shows an embodiment of a redundancy circuit according to a first embodiment of the present invention.

FIG. 3 shows a first embodiment of a redundancy circuit 20, 20', or 20" of FIG. 2. This circuit is formed of n units 29 associated with the n first column conductors of the matrix network 1, 1', or 1" and of a unit 29' associated with the conductor of the redundancy column. The n units 29 include, a selector 30 for routing the address signal present on a conductor Ac0, Ac1, . . . , Ac(n-1), either to column C0, C1, . . . , C(n-1) of same rank, or to the next column C 1, . . . , C(n-1), Cn. Each selector 30 here is formed of two switches 31, 32, which enable switching between a current column and the next column. Each unit 29, 29' includes an element 33, for example, a NAND gate, of detection of the state of the preceding cell and an element 34, for example a MOS transistor, having the function of a reversible fuse of the corresponding cell. Transistors 34 are controlled by a signal Rs forming an order of cell repair by the use of the next column and so on until the redundancy column is reached. Although signal Rs is applied on the gates of all transistors 34, it will be seen hereafter that the control is only effective on the transistor of the addressed column, that is, the signal Ac of which is in the active state.

In the example shown in FIG. 3, the memory circuit is formed of several sets of network 1, 1', 1" and the selection of a set of networks or another is performed via a predecoding address As which enables identification of which of the network sets is selected. Such an architecture is optional. In the present example, the selection means is formed, for each unit 29, of a NOR gate 35, a first input of which receives selection address As, and a second input of which receives the output of switch 31 of the current unit. Column conductor C0, C1, C(n-1), Cn corresponds to the output terminal of gate 35 and is connected to the gate of a MOS transistor 36 connected in series between a first terminal of a transistor 34 of the corresponding cell and the ground. In the absence of a predecoding, the column conductor is connected, via an inverter, to the output of switch 31. A second terminal of transistor 34 is connected to a non-inverting control terminal of switch 31, to an inverting input of switch 32 and to a first input of gate 33 of the corresponding unit 29. A second input of gate 33 of each unit 29, 29', except for the first one, is connected to the second terminal of transistor 34 of the unit of lower rank. The output of gate 33 of each unit 29 is connected to the input of an inverter 37, the output of which is connected to the first input of gate 33. The output of gate 33 of a given unit 29 is also connected to the gate of a MOS transistor 38 of the next unit 29, 29', this transistor 38 being connected in series with a MOS transistor 39 between a positive supply terminal Vdd and the output terminal of the switch 32 of the preceding cell. This output terminal of each switch 32 is also connected to the second input terminal of gate 35 of the next unit. The output of gate 33 of each unit 29 is further connected to an inverting control terminal of switch 31 and to a non-inverting control terminal of the switch 32 of this unit.

The second input of gate 33 of the first unit 29 is connected to voltage Vdd. It should be noted that gate 33 of the first unit 29 is optional. It is however used in practice because it simplifies the reproduction of the redundancy circuit by enabling a repetition of units having the same components. The output terminal of inverter 37 of the last unit 29 forms terminal 23 (FIG. 2) indicative of the use of the (or of the last) redundancy column.

The testing of a memory circuit according to the present invention can be performed conventionally, during manufacturing, from a memory bitmap which is compared to a previously stored model. In case of divergences, the position of the defects enables to determine from which column conductor the shifting has to be performed.

An advantage of the present invention is that it corrects other defects than defects proper to networks 1, 1', 1" of memory cells. Indeed, these can be a defect in the input/output amplifier associated with the column conductor, in the routing multiplexer of the datum present on terminal 8, 8', 8" associated with the column in which the cell is identified as defective, and in any other possible component individually associated with each of the n+1 columns of each memory cell network.

The operation of a redundancy circuit such as shown in FIG. 3 is the following. If the identification of the defective column can be performed conventionally, the shifting from this defective column is performed, according to the present invention, by a column scanning.

If no error is identified, the cell of rank n+1 of circuit 20 and the corresponding column of memory cells is not used. In this case, signal Rs is in the inactive state (for example, "0") and, for each of units 29, switch 31 is in the on state while switch 32, operating in reverse fashion, is in the blocked or non-conducting state. The switch 31 of each selector 30 thus connects the address conductor of the unit corresponding to the first input of gate 35 associated with the corresponding column conductor.

Since the gate of transistor 38 of the first cell is connected to the ground, this first transistor 38 is always on. Transistor 39 of each unit 29, 29' is off as long as its gate is in the high state ("1"), that is, transistor 39 of units 29, 29' is off for all cells of lower rank than a possibly defective column. The second input of gate 33 of the first unit always is at state 1" by being connected to voltage Vdd.

If a defective column is detected, signal Rs is placed in its active state, which turns on transistor 34 as well as transistor 36 of the addressed cell. Indeed, since the gate of transistor 36 is connected to column conductor C0, C1, C(n-1) or Cn of the corresponding unit, this transistor is on only when the unit containing it is addressed. The turning-on of transistors 34 and 36 forces the output of gate 33 to state "1", with switch 32 turning on and switch 31 turning off. As a result, address Ac associated with the column being addressed is transferred by switch 32 onto the second input of gate 35 of the next column. State "1" of gate 33 is transferred, by being inverted, to the first input of gate 33 associated with the next column. Thus, selectors 30 of the next columns which are controlled from the output of the corresponding gate 33 are all controlled to cause a shifting of the column conductor to the next column conductor, from the column where the error has appeared to the redundancy column.

Unit 29 associated with the defective column is, as for itself, disconnected from the general redundancy circuit. Indeed, once transistors 34 and 36 have been simultaneously turned on, they can only be turned back off by powering off the circuit. Signal Rs can thus return to state "0" for the addressing of the next column.

From a static point of view, the outputs of all gates 33 of the columns of lower rank than a defective column are at state "0" and the outputs of gates 33 of the defective column are at state "1". When the system is powered off, this state disappears and the column shifting also disappears, which enables to perform a new test procedure upon each powering-on of the memory circuit.

An advantage of the present invention is that it enables a dynamic and reversible operation of the redundancy circuit. Thus, defects appearing during the operation of the memory circuit can be isolated, by a test procedure.

In other applications of the redundancy circuit to repetitive elements other than memories, this advantage is particularly substantial if temporary defects are likely to appear. The redundancy column is then used to correct a mobile defect, for example, upon each powering-on of the system.

Figure 4:
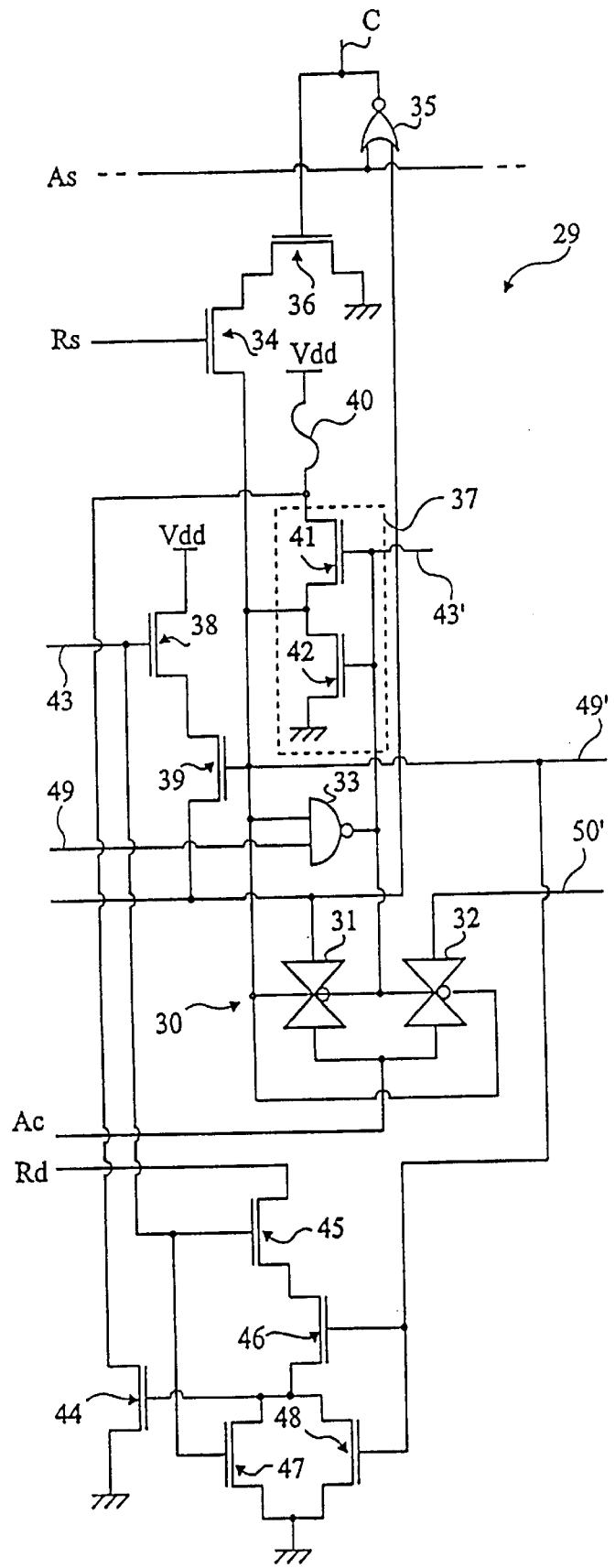
FIG. 4 partially shows a redundancy circuit according to a second embodiment of the present invention.

FIG. 4 shows a second embodiment of a redundancy circuit according to the present invention. In FIG. 4, a single cell of a redundancy circuit according to this second embodiment has been shown.

A feature of this second embodiment is to associate a reversible disconnection means (34, 36) of each column with a fuse 40 of definitive disconnection of this column.

According to the present invention, fuse 40 is, preferably, fused during a memory circuit testing phase during manufacturing, to use the redundancy column in the presence of a manufacturing defect which is, by nature, permanent.

Thus, while enabling the definitive suppression of defects during the manufacturing of the memory circuit, the use of a free redundancy column, that is, of a column unused to correct a manufacturing defect, is authorized, dynamically and reversibly during the operation of the memory circuit.

The general structure of a unit 29 shown in FIG. 4 is substantially similar to the structure discussed in relation with FIG. 3 for the dynamic and reversible operation. Only the differences between the two embodiments linked to the addition of a fuse 40 will be discussed. To enable the programming of a redundancy circuit according to this second embodiment, the circuit includes an additional terminal Rd for causing the fusing of fuse 40 of the unit 29 being addressed during the testing to isolate the corresponding column. Inverter 37 has been shown in detail in FIG. 4 and is formed of two MOS transistors 41, 42, connected in series between a first terminal of fuse 40 and the ground, a second terminal of fuse 40 being connected to voltage Vdd. The gates of MOS transistors 41 and 42 are connected to the output of gate 33 which forms a terminal 43' connected to the gate of transistor 38 (not shown) of the next unit. The midpoint of the series association of transistors 41 and 42 forms the output of inverter 37 connected to the first input of gate 33 of the current unit. The first terminal of fuse 40, which provides the biasing of inverter 37, is connected to the ground via a MOS transistor 44.

If fuse 40 has not fused, that is, if the corresponding column has not been considered as defective during the manufacturing test, the operation of unit 29 shown in FIG. 4 is similar to that discussed in relation with FIG. 3. Transistor 44 is used as a fusing means for fuse 40. Transistor 44 is controlled by an assembly based on MOS transistors 45, 46, 47, 48, controlled by a switching to the high state of signal Rd. Two transistors 47 and 48 are connected in parallel between a series association of two transistors 45 and 46 and the ground, transistor 45 receiving signal Rd. The gate of transistor 45 is connected to a terminal 49, that is, to the output of gate 33 of the preceding unit. The gate of transistor 46 is connected to the output of inverter 37 of the current unit, and thus to a terminal 49' corresponding to the second input of gate 33 of the next unit. Transistors 47 and 48 form a switch similar to switch 31 or 32 and illustrate an embodiment of these switches by analogy.

In the example shown in FIG. 4, it is assumed that a single redundancy column is used. Thus, the fusing of a fuse 40 of a given column occurs at the condition that the signal present on terminal 43 is at state "0", that is, that no preceding column has been corrected yet. Transistor 45 to 48 are on and transistor 44 is off. It is assumed that signal Rd switches to state "1" to indicate a need for a definitive column repair. This switching to state "1" turns on transistor 44, which fuses fuse 40. Thus, transistor 44, turns on, which causes the fusing of fuse 40. As indicated hereabove, this fusing introduces a permanent "0" on the output of inverter 37, which prevents any return to normal operation of the corresponding column.

When fuse 40 has fused, a permanent state "0" is forced on the first input of gate 33 by inverter 37. Thus, selector 30 of the corresponding unit directs address Ac via conduction means 32 and via a link 50' to the next unit. This state "0" at the output of inverter 37 also inhibits the operation of transistors 34 and 36 under the action of a possible signal Rs. Further, this permanently forces the turning-on of transistor 39 and, accordingly, a state "1" on the second input of gate 35, and thus a state "0" on its output. Thus, transistor 36 is permanently off, which eliminates any power consumption in the defective memory column.

The output of gate 33 is forced to state "1", which blocks (renders non-conducting) transistors 45 and 47 of the next unit, preventing the breakdown of another fuse.

If a single redundancy column is used per network of memory cells, a definitive repair forbids the use of a reversible repair. Conversely, if each network is associated with several redundancy columns, there can remain available redundancy columns to perform a reversible repair in addition to the definitive repair performed during the manufacturing of the memory circuit. The modifications to be brought to units 29 are within the abilities of those skilled in the art based on the desired functionality.

It should be noted that the embodiments described in relation with FIGS. 3 and 4 may be modified according to the respective states of repair control signals Rs, Rd. Further, other switching means may be used provided that they respect the functional indication given hereabove.

An advantage of the present invention is that it optimizes the use of a memory circuit equipped with redundancy elements by enabling the use of the redundancy elements associated with each network 1, 1', 1" (FIG. 2) of the memory independently from one another.

Another advantage of the present invention is that it associates a definitive repair of an element of the memory to a repair available to the user.

Of course, the present invention is likely to have various alterations, modifications, and improvements which will readily occur to those skilled in the art. In particular, although the present invention has been described in relation with a memory circuit, the present invention applies, more generally, to any integrated circuit provided with matrix networks of identical elements.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. An integrated circuit including at least one matrix network of identical elements capable of being individually addressed at least in a first direction and including, at least for this first direction, at least one redundancy element, means for reversibly inhibiting the operation of a defective element and for maintaining the circuit operation by using the redundancy element; and means for definitively inhibiting the operation of a defective element wherein said means for reversibly inhibiting is operatively associated with said means for definitively inhibiting.

2. The circuit of claim 1, including several matrix networks of identical elements to be simultaneously addressed in a second direction, including, for each matrix network, a redundancy circuit for organizing the use of a redundancy element associated with this matrix network independently from the other matrix networks.

3. A memory including at least one matrix network of cells and at least one redundancy element associated with a first direction, including at least one redundancy circuit of claim 2 for reversibly modifying the addressing in the first direction to use the redundancy element in the presence of a defective memory cell in the matrix network.

4. The memory of claim 3, including at least n+1 successive columns of cells, wherein the redundancy circuit includes at least n+1 logic units, n first units including a selector for routing an address conductor associated with the corresponding column, either to the memory cells associated with this column, or to the memory cells associated with the next column.

5. The memory of claim 4, wherein each of the n first units further includes a fuse for definitively inhibiting the operation of a defective column.

6. The memory of claim 3, including several matrix networks and, for each network, at least one redundancy element associated with a first direction and at least one redundancy circuit, each redundancy circuit being individually controllable.

* * * * *